United States Patent
Sasaki et al.

(10) Patent No.: US 12,185,502 B2
(45) Date of Patent: Dec. 31, 2024

(54) SEMICONDUCTOR APPARATUS AND ELECTRONIC APPARATUS

(71) Applicant: Fujitsu Limited, Kawasaki (JP)

(72) Inventors: Shinya Sasaki, Ebina (JP); Yoshihiro Nakata, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 201 days.

(21) Appl. No.: 18/147,479

(22) Filed: Dec. 28, 2022

(65) Prior Publication Data
US 2023/0309267 A1 Sep. 28, 2023

(30) Foreign Application Priority Data
Mar. 28, 2022 (JP) .................................. 2022-052036

(51) Int. Cl.
| | | |
|---|---|---|
| H05K 7/20 | (2006.01) | |
| H01L 23/34 | (2006.01) | |
| H01L 23/00 | (2006.01) | |
| H01L 23/40 | (2006.01) | |

(52) U.S. Cl.
CPC ......... *H05K 7/2039* (2013.01); *H01L 23/345* (2013.01); *H01L 23/4006* (2013.01); *H01L 24/10* (2013.01); *H01L 2224/161* (2013.01)

(58) Field of Classification Search
CPC . H01L 23/36; H01L 23/3672; H01L 23/3128; H01L 24/16; H01L 24/32; H01L 2224/16227; H01L 2224/73253; H01L 2924/15311; H01L 23/49816
See application file for complete search history.

(56) References Cited

U.S. PATENT DOCUMENTS

| | | | | |
|---|---|---|---|---|
| 5,126,829 A | * | 6/1992 | Daikoku | H01L 23/4338 257/713 |
| 5,515,912 A | * | 5/1996 | Daikoku | H01L 23/4338 165/185 |
| 5,774,334 A | * | 6/1998 | Kawamura | H01L 23/4338 165/80.4 |
| 9,257,364 B2 | * | 2/2016 | Ahuja | H01L 21/4882 |
| 2002/0066955 A1 | * | 6/2002 | Shibamoto | H01L 23/24 257/E23.101 |

(Continued)

FOREIGN PATENT DOCUMENTS

| | | |
|---|---|---|
| JP | H09-045827 A | 2/1997 |
| JP | 2011-198868 A | 10/2011 |
| JP | 2021-019076 A | 2/2021 |

*Primary Examiner* — Michael A Matey
(74) *Attorney, Agent, or Firm* — ArentFox Schiff LLP

(57) ABSTRACT

A semiconductor apparatus includes a substrate, a plurality of heat generating elements mounted on the substrate, a heat dissipation member fixed to the substrate and disposed such that the heat generating elements are interposed between the heat dissipation member and the substrate, at least one first heat conduction member provided on a first surface of the heat dissipation member, the first surface facing the heat generating elements, and a plurality of second heat conduction members each provided on a second surface of a corresponding one of the heat generating elements, the second surface facing the heat dissipation member, wherein the at least one first heat conduction member and the second heat conduction members are in contact with each other at an interface between opposing surfaces thereof.

9 Claims, 3 Drawing Sheets

(56) References Cited

U.S. PATENT DOCUMENTS

| | | | |
|---|---|---|---|
| 2004/0175862 A1* | 9/2004 | Tao | H01L 23/49816 |
| | | | 257/E23.101 |
| 2011/0228485 A1 | 9/2011 | Usui et al. | |
| 2015/0171063 A1* | 6/2015 | Zhai | H01L 25/50 |
| | | | 257/713 |
| 2018/0233452 A1* | 8/2018 | Lin | H01L 23/3128 |
| 2018/0286818 A1* | 10/2018 | Nam | H01L 23/3128 |
| 2020/0262000 A1* | 8/2020 | Puckett | B23K 1/0008 |
| 2020/0321261 A1* | 10/2020 | Fujino | H01L 23/3128 |
| 2020/0395336 A1* | 12/2020 | Okano | H01L 23/367 |
| 2021/0136917 A1* | 5/2021 | Otsubo | H01L 24/16 |

* cited by examiner

SEMICONDUCTOR APPARATUS AND ELECTRONIC APPARATUS

CROSS-REFERENCE TO RELATED APPLICATIONS

The present application is based upon and claims the benefit of priority from the prior Japanese Patent Application No. 2022-052036 filed on Mar. 28, 2022, with the Japanese Patent Office, the entire contents of which are incorporated herein by reference.

FIELD

The present disclosures relate to semiconductor apparatuses and electronic apparatuses.

BACKGROUND

Some semiconductor apparatuses have a plurality of heat generating elements mounted on a substrate. For example, semiconductor apparatuses used in a base station for mobile phone communication have a plurality of beam forming integrated circuits (i.e., BFIC) mounted on a substrate.

In some semiconductor apparatuses, temperature variations between a plurality of heat generating elements may cause malfunction.

PRIOR ART DOCUMENT

Patent Document

[Patent Document 1] Japanese Laid-Open Patent Publication No. 2011-198868
[Patent Document 2] Japanese Laid-Open Patent Publication No. 2021-19076
[Patent Document 3] Japanese Laid-Open Patent Publication No. H9-45827

SUMMARY

According to an aspect of the embodiment, a semiconductor apparatus includes a substrate, a plurality of heat generating elements mounted on the substrate, a heat dissipation member fixed to the substrate and disposed such that the heat generating elements are interposed between the heat dissipation member and the substrate, at least one first heat conduction member provided on a first surface of the heat dissipation member, the first surface facing the heat generating elements, and a plurality of second heat conduction members each provided on a second surface of a corresponding one of the heat generating elements, the second surface facing the heat dissipation member, wherein the at least one first heat conduction member and the second heat conduction members are in contact with each other at an interface between opposing surfaces thereof.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

Figure 1:
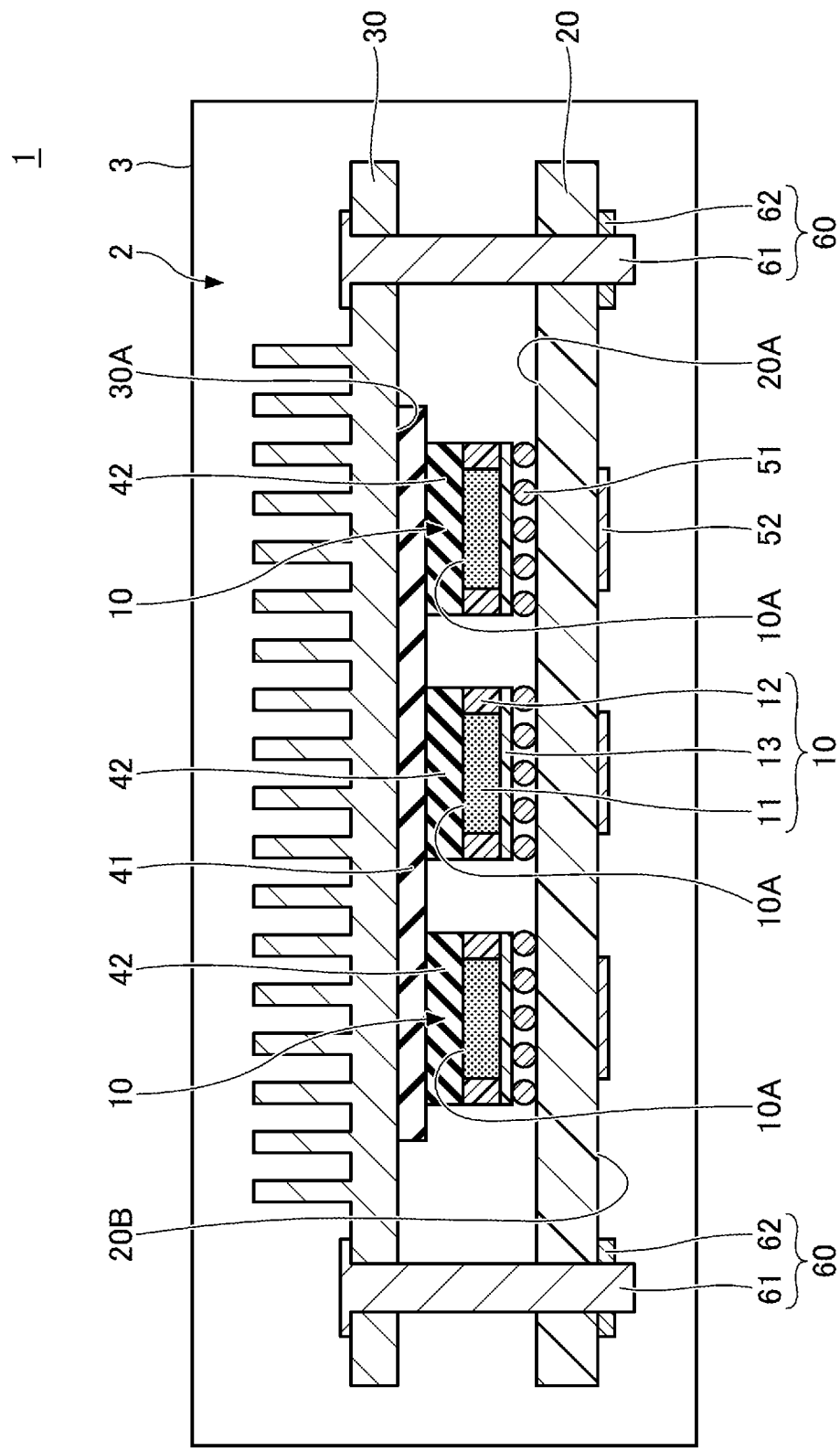
FIG. 1 is a cross-sectional view illustrating an electronic apparatus according to an embodiment.

In the following, embodiments of the present disclosures will be described with reference to the accompanying drawings. In the present specification and the drawings, elements having substantially the same functional configuration are referred to by the same reference numerals, and a duplicate description thereof may be omitted.

The embodiment described below relates to an electronic apparatus. FIG. 1 is a cross-sectional view illustrating an electronic apparatus according to the embodiment.

An electronic apparatus 1 according to the present embodiment is used as a communication device that transmits and receives radio-frequency signals such as millimeter waves. The electronic apparatus 1 includes a semiconductor apparatus 2 and a housing 3. The semiconductor apparatus 2 is housed in the housing 3.

The semiconductor apparatus 2 mainly includes a plurality of fan-out wafer level packages (FOWLP) 10, a printed circuit board 20, a heatsink 30, a first thermal interface material (TIM) 41, a plurality of second TIMs 42, and fixing members 60.

The plurality of FOWLPs 10 are mounted on one surface 20A of the printed circuit board 20. In the present embodiment, the side of the printed circuit board 20 on which the FOWLPs 10 are mounted is referred to as an upper side, and the opposite side is referred to as a lower side. It should be noted that the electronic apparatus and the semiconductor apparatuses can be used upside down or can be arranged at any angle. A plan view refers to a view of an object from the direction normal to the surface 20A of the printed circuit board 20, and a plane shape refers to the shape of an object as viewed from the direction normal to the surface 20A of the printed circuit board 20.

The plurality of FOWLPs 10 are mounted on the upper surface 20A of the printed circuit board 20 via solder balls 51. The FOWLP 10 includes a semiconductor chip 11, an encapsulation resin 12, and a re-distribution layer 13. The semiconductor chip 11 and the encapsulation resin 12 are disposed on the re-distribution layer 13. The solder balls 51 are in direct contact with external terminals (not illustrated) disposed on the re-distribution layer 13. In this embodiment, the upper surface of the semiconductor chip 11 is exposed outside the encapsulation resin 12. The upper surface of the semiconductor chip 11 is flush with the upper surface of the encapsulation resin 12. The semiconductor chip 11 is, for example, a BFIC. When the electronic apparatus 1 is used for communication in the 28-GHz band, for example, the FOWLPs 10 are arranged at a 10.4-mm pitch. When the electronic apparatus 1 is used for communication in the 39-GHz band, the FOWLPs 10 are arranged at a 7.7-mm pitch. The FOWLP 10 is an example of a heating device.

Antenna conductors 52 are disposed on the lower surface 20B of the printed circuit board 20. The antenna conductors 52 are electrically connected to the FOWLPs 10 via interconnects in the printed circuit board 20 and the solder balls 51. The printed circuit board 20 is an example of a substrate.

The heatsink 30 is disposed such that the FOWLPs 10 are interposed between the heatsink 30 and the printed circuit board 20. The heatsink 30 is made of, for example, aluminum or an aluminum alloy. The heatsink 30 is an example of a heat dissipation member.

The first TIM 41 is disposed on the surface 30A of the heatsink 30, the surface 30A facing toward the FOWLPs 10. The first TIM 41 is compression bonded to the heatsink 30. The first TIM 41 is solid. That is, the first TIM 41 does not have fluidity, for example. The first TIM 41 is formed as, for example, a rubber or a sheet. The first TIM 41 is made of, for example, carbon fibers. The carbon fibers are preferably oriented in a specific direction. The first TIM 41 may alternatively be made of, for example, a resin such as a silicone resin. The resin contained in the first TIM 41 preferably has a glass transition point of 30° C. or lower. The first TIM 41 may contain a filler such as an alumina filler dispersed therein. The thermal expansion coefficient of the first TIM 41 in the thickness direction (i.e., the direction perpendicular to the surface 20A of the printed circuit board 20) is preferably 80 ppm/K or more, more preferably 100 ppm/K or more, and still more preferably 120 ppm/K or more. The thermal conductivity of the first TIM 41 is, for example, 5 W/m·K to 30 W/m·K. The first TIM 41 is an example of a first heat conductive member. The surface 30A is an example of a first surface.

The second TIM 42 is disposed on the surface 10A of the FOWLP 10, the surface 10A facing the heatsink 30. The second TIM 42 is compression bonded to the FOWLP 10. The second TIM 42 is solid. That is, the second TIM 42 does not have fluidity, for example. The second TIM 42 is formed as, for example, a rubber or a sheet. The second TIM 42 may be made of, for example, a resin such as a silicone resin. The resin contained in the second TIM 42 preferably has a glass transition point of 30° C. or lower. The second TIM 42 may contain a filler such as an alumina filler dispersed therein. The thermal expansion coefficient of the second TIM 42 in the thickness direction is preferably 80 ppm/K or more, more preferably 100 ppm/K or more, and still more preferably 120 ppm/K or more. The second TIM 42 may alternatively be made of carbon fibers, for example. The thermal conductivity of the second TIM 42 is, for example, 5 W/m·K to 30 W/m·K. The second TIM 42 is an example of a second heat conductive member. The surface 10A is an example of a second surface.

The fixing members 60 each include a bolt 61 and a nut 62. A plurality of through holes are formed in the printed circuit board 20 and the heatsink 30, and the shafts of the bolts 61 are inserted into the through holes. The heads of the bolts 61 are in contact with the upper surface of the heatsink 30, and the nuts 62 are attached to the shafts of the bolts 61 from the lower side of the printed circuit board 20, for example. The fixing members 60 secure the heatsink 30 to the printed circuit board 20.

Figure 2:
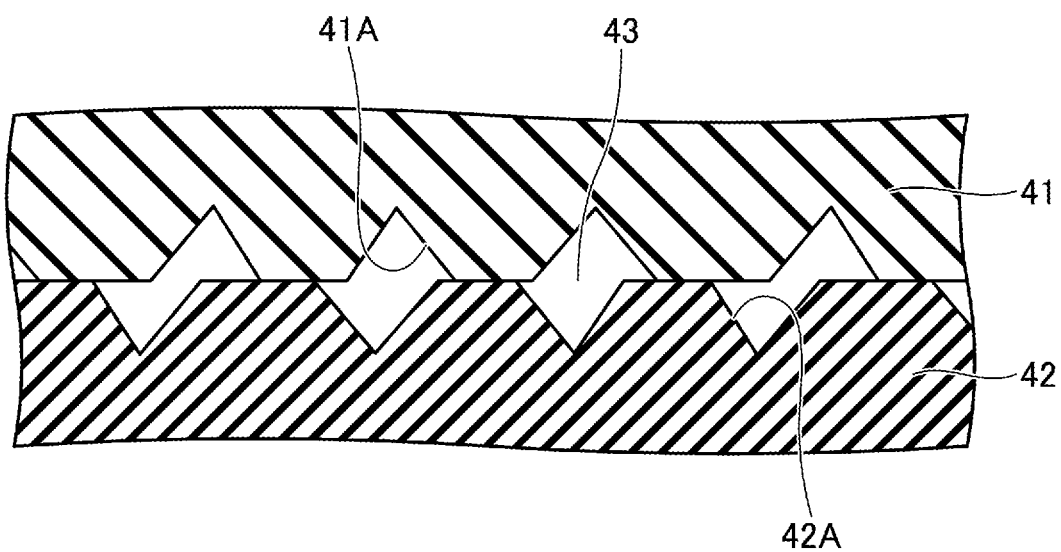
FIG. 2 is a cross-sectional view illustrating the fine structures of a first TIM and a second TIM.

In the following, the relationship between the first TIM 41 and the second TIMs 42 will be described. FIG. 2 is a cross-sectional view illustrating the fine structure of the first TIM 41 and the second TIM 42.

As illustrated in FIG. 2, the first TIM 41 and the second TIM 42 are in contact with each other. The first TIM 41 and the second TIM 42 adjoin each other at an interface between the opposing surfaces thereof. The lower surface 41A of the first TIM 41 and the upper surface 42A of the second TIM 42 are not completely flat surfaces, and surface irregularities inevitably exist in the lower surface 41A of the first TIM 41 and the upper surface 42A of the second TIM 42. Under the condition of a temperature of 30° C., for example, spaces are present between the surface 41A and the surface 42A. These spaces contain a gas 43 such as air. That is, the first TIM 41 and the second TIM 42 are in contact with each other with the gas 43 trapped at places therebetween under the condition of a temperature of 30° C., for example.

Figure 3:
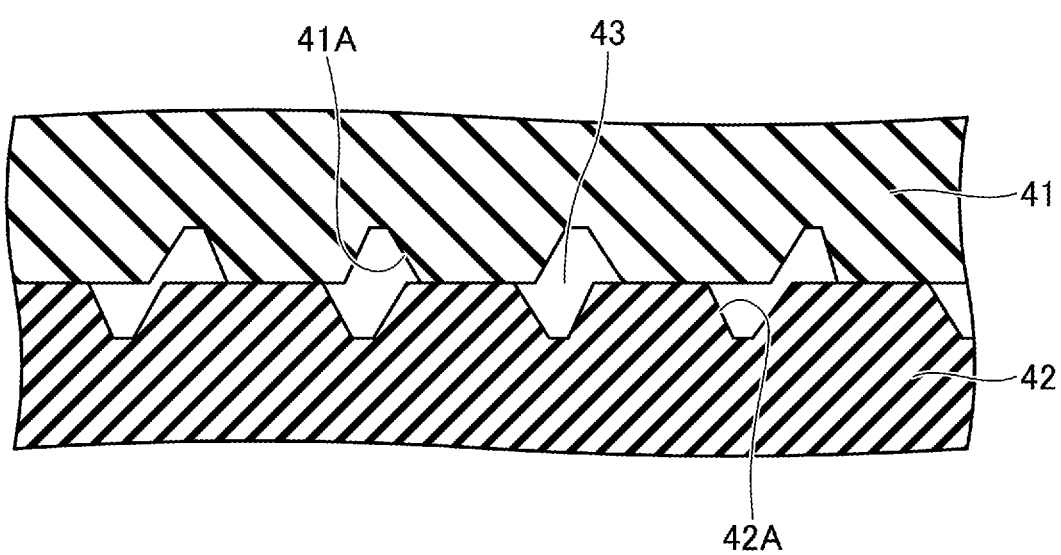
FIG. 3 is a cross-sectional view illustrating changes in the shapes of the first TIM and the second TIM due to a temperature change.
Figure 4:
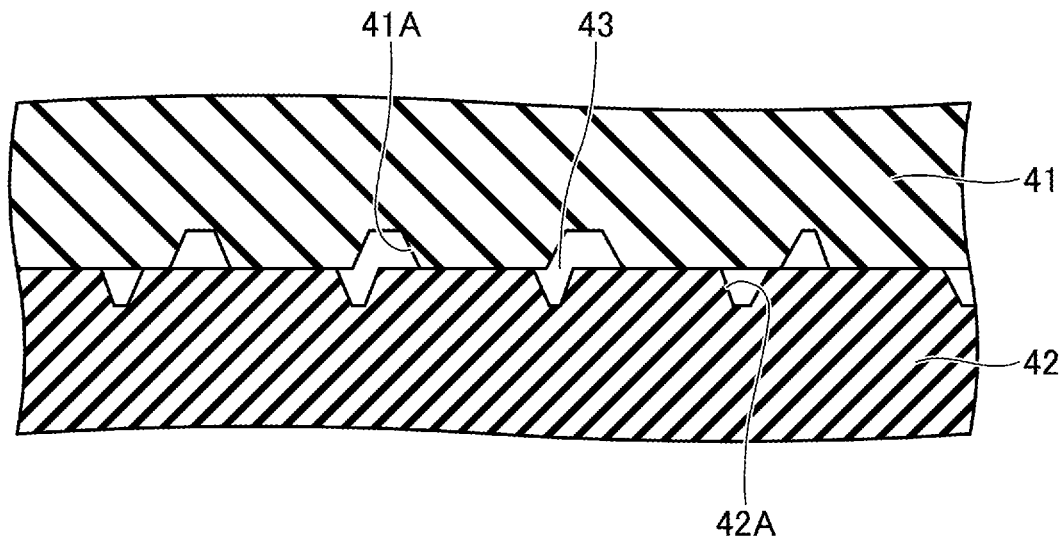
FIG. 4 is a cross-sectional view illustrating changes in the shapes of the first TIM and the second TIM due to a temperature change.
Figure 5:
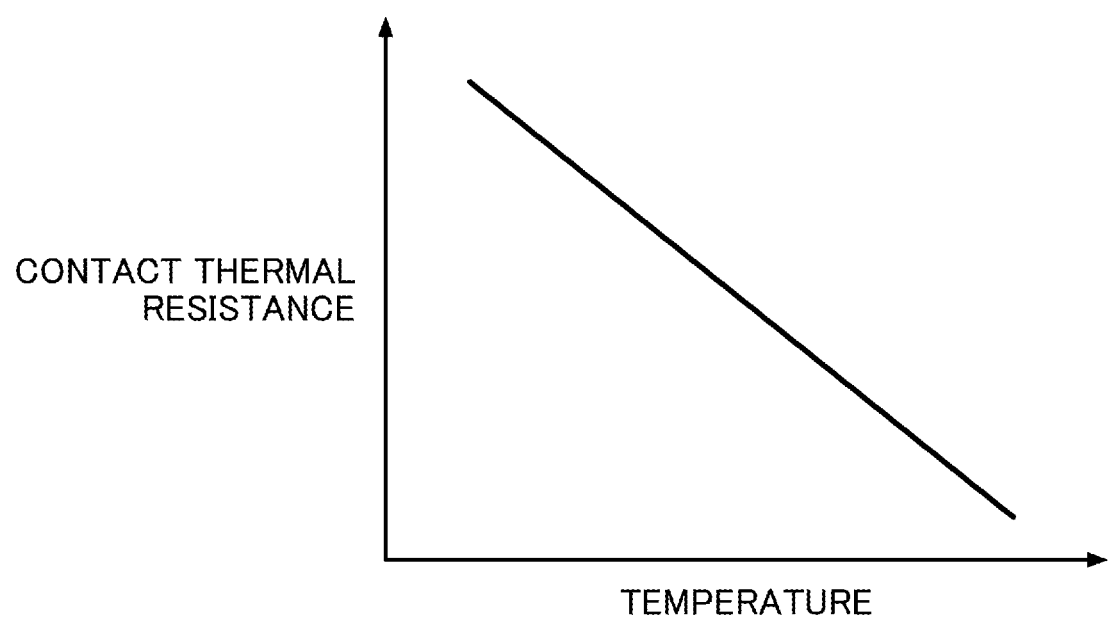
FIG. 5 is a diagram illustrating the temperature dependency of contact thermal resistance between the first TIM and the second TIM.

In the following, the temperature dependency of contact thermal resistance between the first TIM 41 and the second TIM 42 will be described. FIGS. 3 and 4 are cross-sectional views illustrating changes in the shapes of the first TIM 41 and the second TIM 42 due to temperature changes. FIG. 5 is a diagram illustrating the temperature dependency of contact thermal resistance between the first TIM 41 and the second TIM 42.

The volumes of the first TIM 41 and the second TIM 42 increase as temperature increases. For example, relative to the state illustrated in FIG. 2 at a temperature of 30° C., the first TIM 41 and the second TIM 42 expand at a temperature of 80° C. As illustrated in FIG. 3, the spaces are thus narrowed and the amount of the gas 43 decreases. This means that at a temperature of 80° C., the contact area between the first TIM 41 and the second TIM 42 is larger than the contact area observed at a temperature of 30° C. Similarly, at a temperature of 130° C. the first TIM 41 and the second TIM 42 further expand, as a result of which the spaces are further narrowed as illustrated in FIG. 4, with a further decreased amount of the gas 43. This means that at a temperature of 130° C., the contact area between the first TIM 41 and the second TIM 42 is larger than the contact area observed at a temperature of 80° C. The contact thermal resistance between the first TIM 41 and the second TIM 42 changes depending on the contact area between the first TIM 41 and the second TIM 42. Specifically, the larger the contact area is, the smaller the contact thermal resistance is. Therefore, as illustrated in FIG. 5, the higher the temperature is, the smaller the contact thermal resistance is.

As the FOWLP 10 runs, the temperature of the FOWLP 10 increases. In the direction perpendicular to the surface 20A of the printed circuit board 20, heat generated in the FOWLP 10 is transferred to the heatsink 30 mainly through the second TIM 42 and the first TIM 41, and is released to the outside. Heat generated at the FOWLP 10 also spreads in the directions parallel to the surface 20A of the printed circuit board 20. Because of this, even when each FOWLP 10 generates an equal amount of heat, heat is likely to stay around the FOWLP 10 disposed near the center, and is likely to be dissipated to the outside around the FOWLP 10 disposed near the periphery. As a result, in the present embodiment, the second TIM 42 disposed near the center thermally expands more than the second TIM 42 disposed near the periphery, as a result of which the contact thermal resistance becomes lower around the center than around the periphery. Consequently, heat generated in the FOWLP 10 disposed near the center is more easily transferred to the heatsink 30.

As described above, in the present embodiment, heat is easily transferred to the heatsink 30 from the FOWLP 10 disposed near the center, and heat is easily dissipated in the directions parallel to the surface 20A of the printed circuit board 20 from the FOWLP 10 disposed near the periphery. According to the present embodiment, it is thus possible to reduce a temperature variation between the FOWLPs 10.

In the following, a method of making the semiconductor apparatus 2 will be described.

First, the printed circuit board 20 on which the antenna conductors 52 are formed is prepared, and the FOWLPs 10 are mounted on the surface 20A of the printed circuit board 20 via the solder balls 51. Next, the second TIMs 42 are compression bonded to the upper surfaces of the FOWLPs 10. At this time, the second TIMs 42 may be compression bonded while heat is applied. That is, thermocompression bonding of the second TIMs 42 may be performed.

The heatsink 30 is prepared, and the first TIM 41 is compression bonded to the surface 30A of the heatsink 30. At this time, the first TIM 41 may be compression bonded while heat is applied. That is, thermocompression bonding of the first TIM 41 may be performed.

Subsequently, the heatsink 30 is put in place such that the second TIMs 42 come into contact with the first TIM 41, and the heatsink 30 is fixed to the printed circuit board 20 with the fixing members.

Manufacturing of the semiconductor apparatus 2 can properly be done in the manner described above.

The first TIM 41 and the second TIM 42 may have an equal thermal expansion coefficient, or have different thermal expansion coefficients, in the thickness direction. It may be noted, however, that the second TIM 42, which is in direct contact with the heat generating FOWLP 10, preferably has a greater thermal expansion coefficient in the thickness direction than the first TIM 41 from the viewpoint of increasing the amount of thermal expansion in the thickness direction.

For the following reason, either the first TIM 41, the second TIM 42, or both have a thermal expansion coefficient of 100 ppm/K or more in the thickness direction. The value of thermal resistance between the first TIM 41 and the second TIM 42 may be 0.1° C./W at a temperature of 30° C. For example, when the planar shape of the FOWLP 10 is a square of 7 mm×7 mm, providing a distance of 0.1 μm between the first TIM 41 and the second TIM 42 creates a thermal resistance of about 0.1° C./W between the first TIM 41 and the second TIM 42. It is preferable that the first TIM 41 and the second TIM 42 are thin in order to reduce thermal resistance attributable to the thermal conductivity of these materials. In consideration of the ease of handling during the manufacturing process, a thickness of about 0.1 mm is used, for example. In such a case, the provision of a thermal expansion coefficient of greater than or equal to 100 ppm/K allows changes in the contact thermal resistance to reduce temperature variation even if a temperature difference of 10° C. occurs between the FOWLPs 10.

In the present disclosure, the first heat conduction member does not need to be provided in common for the plurality of second heat conduction members, and may be provided separately for each second heat conduction member. For example, the number of sets each comprised of a heat generating element and a second heat conduction member may be the same as the number of first heat conduction members in the semiconductor apparatus, and each first heat conduction member may be in contact with a different second heat conduction member.

Further, the heat generating elements are not limited to the FOWLPs 10, and various elements that generate heat upon activation can be used as the heat generating elements. Further, the semiconductor chip 11 included in the FOWLP 10 does not need to be in direct contact with the second TIM 42. The encapsulation resin 12 may be provided between the semiconductor chip 11 and the second TIM 42. Moreover, an adhesive may be used as an alternative fixing member.

In the following, an experiment conducted by the present inventors will be described. In this experiment, three samples were produced.

The first sample was a sample according to the above-described embodiment, for which a semiconductor chip for communication in the 39-GHz band was used as the semiconductor chip 11. The semiconductor chip had a square plane shape of 6 mm×6 mm, and was 400 μm thick. Thirty-two FOWLPs each including one semiconductor chip 11 were prepared and mounted on a printed circuit board in a 4-by-8 square lattice arrangement. The pitch of the FOWLPs was 7.7 mm. Thereafter, a TIM made of a silicone resin mixed with an alumina filler was bonded to the upper surface of each FOWLP as a second TIM by thermocompression bonding. This TIM had a thermal conductivity of 8 W/m·K and a thermal expansion coefficient of 120 ppm/K.

In addition, an aluminum heatsink was prepared, and a TIM sheet containing oriented carbon fibers was thermocompression-bonded to the lower surface of the heatsink as the first TIM. This TIM had a thermal conductivity of 20 W/m·K and a thermal expansion coefficient of 40 ppm/K.

Subsequently, the heatsink was fixed to the printed circuit board using fixing members. With this, the first sample was completed in final form.

The second sample is a sample obtained by removing the TIM corresponding to the first TIM from the first sample. That is, in the second sample, the TIMs made of a silicone resin mixed with an alumina filler corresponding to the second TIM are in direct contact with the heatsink 30. Other configurations are the same as those of the first sample.

The third sample is a sample in which a TIM corresponding to the second TIM is different from that of the first sample. To be more specific, grease having thermal conductivity of 3 W/m·K was used as a TIM corresponding to the second TIM. The grease had fluidity, and the surface irregularities existing on the lower surface of the TIM corresponding to the first TIM is filled with the grease.

In the first sample, the second sample, and the third sample, heat was generated by the semiconductor chips at 4 W, and the temperature distribution in each sample was measured.

In the first sample, temperature in the vicinity of four FOWLPs located at the center, among the 32 FOWLPs, was 135° C., and temperature in the vicinity of four FOWLPs located at the corners was 134° C. That is, the temperature difference was only 1° C.

In the second sample, temperature in the vicinity of four FOWLPs located at the center, among the 32 FOWLPs, was 135° C., and temperature in the vicinity of four FOWLPs located at the corners was 125° C. That is, the temperature difference was 10° C. The reason for this appears to be that the nonexistence of a TIM corresponding to the first TIM results in small temperature-caused changes in the contact area and thus the small temperature dependency of contact thermal resistance.

In the third sample, temperature in the vicinity of four FOWLPs located at the center, among the 32 FOWLPs, was 140° C., and temperature in the vicinity of four FOWLPs located at the corners was 130° C. That is, the temperature difference was 10° C. The reason for this appears to be that the contact area exhibits substantially no changes and the temperature dependency of contact thermal resistance is thus small.

Although preferred embodiments and the like have heretofore been described in detail, the present invention is not limited to the above-described embodiments and the like, and various variations and modifications may be made to the above-described embodiments and the like without departing from the scope defined in the claims.

According to the present disclosures, it is possible to suppress variation in temperature among a plurality of heat generating elements mounted on a substrate.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor apparatus comprising:
   a substrate;
   a plurality of heat generating elements mounted on the substrate;
   a heat dissipation member fixed to the substrate and disposed such that the heat generating elements are interposed between the heat dissipation member and the substrate;
   at least one first heat conduction member provided on a first surface of the heat dissipation member, the first surface facing the heat generating elements; and
   a plurality of second heat conduction members each provided on a second surface of a corresponding one of the heat generating elements, the second surface facing the heat dissipation member,
   wherein the at least one first heat conduction member and the second heat conduction members are in contact with each other at an interface between opposing surfaces thereof,
   wherein in a direction perpendicular to a surface of the substrate on which the heat generating elements are mounted, a thermal expansion coefficient of the second heat conduction members is greater than a thermal expansion coefficient of the at least one first heat conduction member, and
   wherein the heat generating elements each include a fan-out wafer level package.

2. The semiconductor apparatus as claimed in claim 1, wherein the at least one first heat conduction member and the second heat conduction members are solid.

3. The semiconductor apparatus as claimed in claim 1, wherein the at least one first heat conduction member contains a resin having a glass transition point of 30° C. or lower.

4. The semiconductor apparatus as claimed in claim 1, wherein the second heat conduction members contain a resin having a glass transition point of 30° C. or lower.

5. The semiconductor apparatus as claimed in claim 1, wherein the heat generating elements each include a semiconductor chip that is in direct contact with a corresponding one of the second heat conduction members.

6. The semiconductor apparatus as claimed in claim 1, further comprising a fixing member configured to fix the heat dissipation member to the substrate.

7. The semiconductor apparatus as claimed in claim 1, wherein the at least one first heat conduction member has a thermal expansion coefficient of 80 ppm/K or more in a direction perpendicular to a surface of the substrate on which the heat generating elements are mounted.

8. The semiconductor apparatus as claimed in claim 1, wherein the second heat conduction members each has a thermal expansion coefficient of 80 ppm/K or more in a direction perpendicular to a surface of the substrate on which the heat generating elements are mounted.

9. An electronic apparatus comprising the semiconductor apparatus of claim 1.

\* \* \* \* \*